United States Patent [19]
Clark, II

[11] Patent Number: 5,654,703
[45] Date of Patent: Aug. 5, 1997

[54] PARALLEL DATA COMPRESSION AND DECOMPRESSION

[75] Inventor: Airell R. Clark, II, Albany, Oreg.

[73] Assignee: Hewlett-Packard Company, Palo Alto, Calif.

[21] Appl. No.: 664,901

[22] Filed: Jun. 17, 1996

[51] Int. Cl.⁶ .................................................. H03M 7/30
[52] U.S. Cl. ................................ 341/51; 341/60; 341/106; 348/408
[58] Field of Search ............................. 341/51, 60, 106, 341/52, 55, 87; 348/408

[56] References Cited

U.S. PATENT DOCUMENTS

| | | | |
|---|---|---|---|
| 4,464,650 | 8/1984 | Eastman et al. | 340/347 DD |
| 4,558,302 | 12/1985 | Welch | 340/347 DD |
| 4,881,075 | 11/1989 | Weng | 341/87 |
| 5,175,543 | 12/1992 | Lantz | 341/51 |
| 5,373,290 | 12/1994 | Lempel et al. | 341/51 |
| 5,379,070 | 1/1995 | Retter et al. | 348/403 |
| 5,455,576 | 10/1995 | Clark, II et al. | 341/87 |
| 5,608,396 | 3/1997 | Cheng et al. | 341/50 |

FOREIGN PATENT DOCUMENTS

| | | |
|---|---|---|
| 0313190 | 8/1988 | European Pat. Off. . |
| 0380294 | 1/1990 | European Pat. Off. . |

OTHER PUBLICATIONS

"Practical Dictionary Management for Hardware Data Compression", Development of a Theme by Ziv & Lempel, Department of Computer Science & Engineering, FR-35, University of Washington, Seattle, WA 98195, 33–50.

"A Method for the Construction of Minimum–Redundancy Codes", by David A. Huffman, Associate, IRE, Copyright 1952 by the Institute of Electrical and Electronics Engineers, Inc., Reprinted from Proc. IRE, 40(9), 1098–1101 (1952), pp. 31–34.

"Fundamentals Of Interactive Computer Graphics" The Systems Programming Series, by: J.D. Foley & A. Van Dam, Addison–Wesley Publishing Company, pp. 606–621.

"Color Science: Concepts & Methods, Quantitative Data and Formulae" Second Edition, by Gunfer Wyszecki and W.S. Stiles, Copyright 1982 by John Wiley & Sons, Inc., 2nd Ed., pp. 118–130.

Primary Examiner—Todd DeBoer

[57] ABSTRACT

An apparatus and method for parallel data compression and decompression uses packing and unpacking of data which has multi-variable components, for example, relational multi-variable content data such as tristimulus color space data used in color hard copy applications. Multiple input words are compressed in parallel compression engines and fed in parallel to a packer device which configures the codes in an order determined by order of compression and byte count for each word into a single bit string code. In the decompression cycle of the process, an unpacker device separates the single bit string code based upon length of a data string represented by a code word last decoded by either the decompression engine for that code word if the decompression engine is idle, or the length of the string that has been decoded so far if the decompression engine is currently working on a code.

17 Claims, 4 Drawing Sheets

PARALLEL DATA COMPRESSION AND DECOMPRESSION

BACKGROUND OF THE INVENTION

1. Field of the Invention

The present invention relates generally to data compression and, more particularly, to a method for parallel compression and decompression of multi-byte, or wide, word data. An exemplary embodiment relates the present invention to parallel compression and decompression of primary color data for an implementation in a hard copy apparatus hardware feasible manner without impacting compression ratio or throughput factors.

2. Description of Related Art

It is known in the art to encode a stream of digital data signals (also referred to herein as "data words" or simply "words") into compressed digital code signals. Similarly, decoding of the compressed digital code signals back into the original data is known in the art. The purpose is to effect a savings in the amount of storage required to hold the full data set or to reduce the amount of time required to transmit a given data set (also referred to as "data throughput"). "Compression ratio" is defined as the ratio of the length of the encoded output data to the length of the original input data; the smaller the ratio, the greater the saving in needed storage capacity or reduction in transmission time.

For example, in color laser printing, it is necessary to have an entire page of information in a storage buffer, such as a random access memory ("RAM") integrated circuit, before the printer engine enters a print cycle. Variations of the basic Lev-Zempel data compression technique (see U.S. Pat. No. 4,464,650 (Eastman) and U.S. Pat. No. 4,558,302 (Welch)) are used in compacting the very large amount of data in the digitized, full color image that is to be printed. As print density, dots per inch ("dpi"), increase to improve the print quality, the amount of RAM needed obviously increases. Typically, RAM is a relatively expensive component of the entire system. Moreover, the data stream structure is relatively complex as color data is expressed in tristimulus space values. For example, every picture element, or "pixel," of the image is coded into an 8-bit byte, or word, for cyan, an 8-bit word for yellow, and an 8-bit word for magenta. (The fundamentals of such three-dimensional trichromatic constructs are discussed in the literature, such as Principles of Color Technology, Billmeyer and Saltzman, J. Wiley & Sons, Inc. publ., N.Y., copr 1981 (2d ed.) and Color Science: Concepts and Methods, Quantitative Data and Formulae, by Wyszecki and Stiles, J. Wiley & Sons, Inc. publ., N.Y., copr. 1982 (2d ed.), incorporated herein by reference. A variety of tri-variable color models are described by Foley and Van Dam in Fundamentals of Interactive Computer Graphics, Adison-Wesley Publishing Company at pages 606–621, incorporated herein by reference.)

At first glance, it would appear to be a simple, straightforward task to take three, equal length, data strings representing any multi-variable type data, send each to a separate compressor, store or transmit the compressed variables, then decompress each separately. However, many data compression algorithms employ variable length encoding schemes. (For example, Huffman encoding, first described by David A. Huffman in the IEEE, Proc. IRE, 40(9), 1098–1101 (1952), entitled A Method for the Construction of Minimum-Redundancy Codes, incorporated herein by reference, has variations and uses described in over one hundred U.S. patents.) Thus, each individually coded bit string must be decoded in the same fashion that it was encoded. That is, the decompression must exactly reverse the compression methodology. Additional hardware overhead would be required to write and read from multiple, different memory locations simultaneously.

Another solution would be to combine the compressed output streams into a single record which could be stored in a single location. Tagging every code with extra identifier bits that identify which compression stream a particular string originated from would accomplish this. However, this adversely impacts compression ratio.

Another manner would be to use first-in, first-out ("FIFO") buffering of the data. However, this leads to the need for further, data-dependent hardware and still requires some compensation methodology where variable length encoding is employed. Thus, such a solution is expensive and results in data transmission delays.

Therefore, there is a need for a method and apparatus that will provide parallel processing of multi-variable data compression and decompression within feasible, economically acceptable, design constraints for hardware implementation and which will not affect the compression ratio or data throughput.

SUMMARY OF THE INVENTION

In its basic aspects, the present invention provides a method for parallel encoding of a data set wherein the data set of relational multi-variable content data is set forth in data words, one for each variable of the data. The method includes the steps of: encoding data words in parallel into coded data words, one for each variable of the data; transmitting the coded data words in parallel; receiving the coded data words in a means for packing the coded data words into a single word bit string; packing the coded data words into a single word bit string in an order based upon order of compression and byte count for each of the coded data words, respectively; and transmitting the single word bit string from the means for packing. The packed coded data words can then be unpacked into the separate coded data words and sent to a set of parallel decompression engines.

In another basic aspect of the invention there is provided an apparatus for parallel data compression and decompression. The apparatus includes:

N data compression engines, where "N"=number of data words to be compressed in parallel;

packing means for receiving from the N data compression engines N data word codes in parallel, for serially packing received N data word codes in an order determined by order of compression and byte count for each of the N data word codes, and for transmitting N packed data word codes as a single code word data string;

N data decompression engines; and unpacking means for receiving from the packing means the single code word data string, unpacking the single code word data string, and sending N unpacked data word codes on N parallel outputs to the N data decompression engines in a order based on length of a single code word data string represented by an unpacked data word code last decoded by either the decompression engine for that unpacked data word code if the decompression engine is idle, or the length of the single code word data string that has been decoded so far if the decompression engine is currently working on an unpacked data word code.

It is an advantage of the present invention that it provides parallel compression and decompression of multi-variable data bit strings.

It is another advantage of the present invention that it performs parallel data compression and decompression in hardware that is not data dependent.

It is another advantage of the present invention that it provides a method for combining multiple compressed data records into a single compressed data record without decreasing the compression ratio.

It is another advantage of the present invention that it provides a method for combining multiple compressed data records into a single compressed data record without decreasing the data throughput.

It is another advantage of the present invention that it provides a method for combining the output of multiple Lev-Zempel compression engines in a way that requires no extra information other than the ordering of the codes.

It is still another advantage of the present invention that the methodology is expandable from two to an integral number of parallel compression-decompression engines, limited commercially on by implementation cost factors.

Other objects, features and advantages of the present invention will become apparent upon consideration of the following explanation and the accompanying drawings, in which like reference designations represent like features throughout the drawings.

The drawings referred to in this specification should be understood as not being drawn to scale except if specifically noted.

DESCRIPTION OF THE PREFERRED EMBODIMENT

Reference is made now in detail to a specific embodiment of the present invention, which illustrates the best mode presently contemplated by the inventor for practicing the invention. In order to assist the understanding of the present invention, it is described in terms of an exemplary embodiment of a color laser printer system. Another possible application would be the compressing of data going onto large buses inside a computer (inter-chip buses are expanding to 32, 64, and even 128 bit-widths in the state of the art) to increase bandwidth without increasing the bus frequency. Thus, it will be understood that the exemplary embodiment is not intended, nor should it be interpreted, as a limitation on the scope of the invention which is defined by the claims hereinafter. While in the exemplary embodiment tri-variable data is used, the method of the present invention can be applied to any number of compression-decompression engines used in parallel. Alternative embodiments are also briefly described as applicable.

Figure 1:
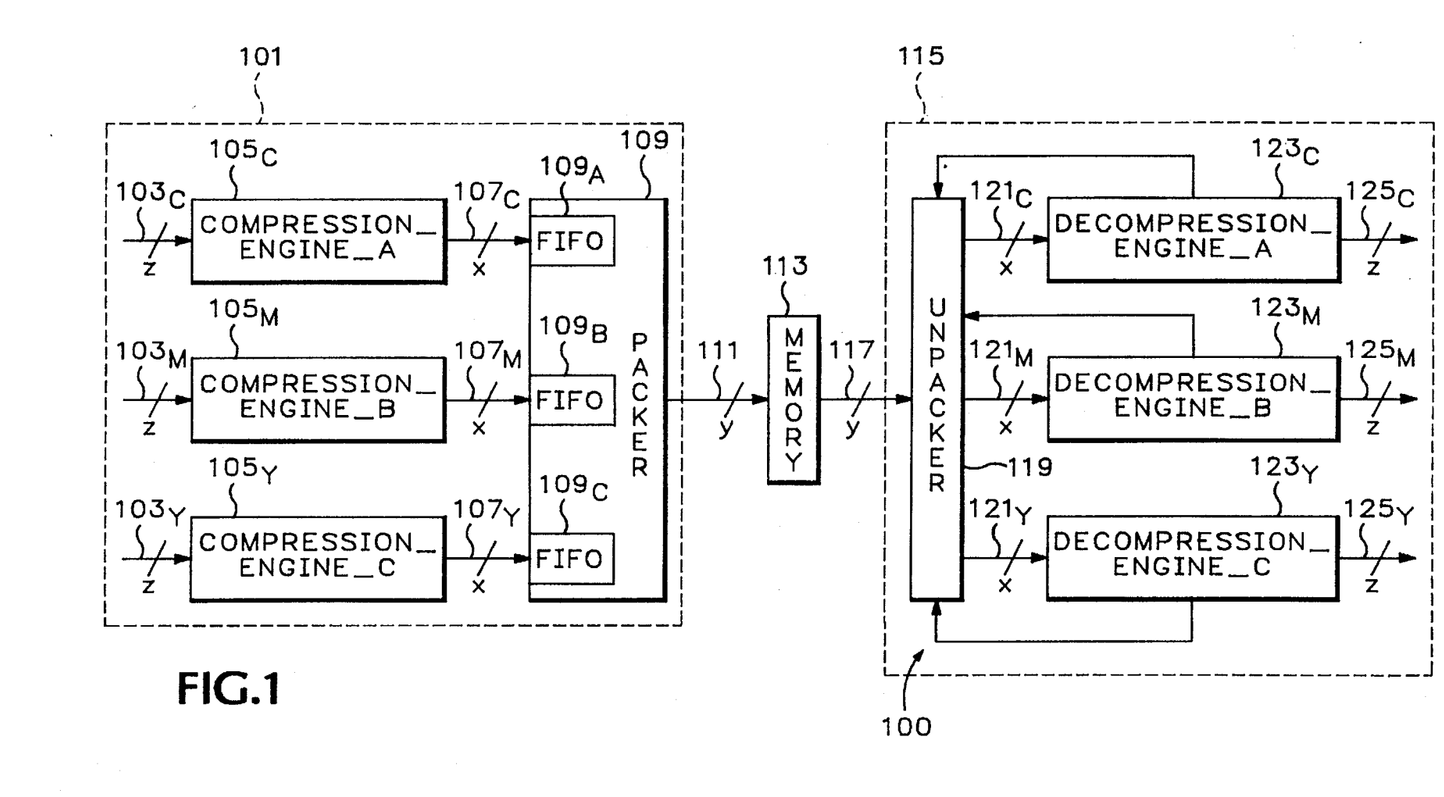
FIG. 1 is a schematic block diagram of an exemplary system in which the methodology of the, resent invention may be employed.

A color printer uses three color planes (four if black is kept separately; for this explanation it will be assume that it is not; extension to a four plane implementation will be recognized by those skilled in the art), using three 8-bit data words, which would comprise a 24-bit string. For a color image, a huge amount of data must be handled rapidly to produce color hard copies and provide an acceptable throughput. A parallel compression decompression system 101 for handling the data in accordance with the present invention is shown in FIG. 1.

In an overview, 8-bit words are transferred in from, for example, a host computer or video display (not shown) via individual 8-bit input buses $103_{CMY}$ to a data compression system 101 in accordance with the present invention. Each input bus $103_{CMY}$ is connected to a respective, individual compression engine $105_{CMY}$ (labeled COMPRESSION ENGINE_A through_C) as would be known in the art, which will operate in parallel. Following compression, the output codes are sent on three output buses $107_{CYM}$, respectively, [note that the bit-width of the now coded data words will be dependent upon the specific compression algorithm employed in the compression engines]. The output codes are sent to combinatorial logic circuitry—referred to hereinafter as a "packer"—109 via input FIFO registers $109_{ABC}$, respectively. The packer 109 will rearrange the order of these output codes in such a way that it will be possible to later extract and decompress the codes as will be explained in detail hereinafter.

The rearranged output codes, i.e. a string of coded data words, can then be sent on an output bus 111, e.g. a local area network ("LAN") line, from the packer 109 to a memory 113, such as a DRAM input data storage buffer of a laser printer which includes the unpacker and decompression engines, represented by the dashed line as element 115. In turn, the memory 113 transfers the output codes via an output bus 117 to separation logic circuitry—referred to hereinafter as an "unpacker"—119 to separate the compressed data stream into its three 8-bit output code components. Each component is then transferred via a respective 8-bit output bus $121_{CMY}$ of the unpacker 119 to three decompression engines $123_{CMY}$ which, like the compression engines $105_{CMY}$, will also operate in parallel. The restored output codes are then sent on individual 8-bit output buses $125_{CMY}$ to the printer engine (not shown).

Each compression engine $103_{CMY}$ will output "unpacked" codes to the packer 109. "Unpacked" means that if the engines $103_{CMY}$ produce "x"-bit codes based upon "z"-bit data words (in the exemplary embodiment z=8) and the output bus 111 from the compression system 101 is "y"-bits wide, where "x" can be greater than or less than "y" ("x" is typically between nine and sixteen and "y" is typically eight), then the input into the packer should be x-bits wide. Packing of the x-bit wide codes into y-bit output symbols will occur.

Along with each code, the compression engines $105_{CMY}$ output the bit-size—"count"—in input symbols (typically bytes) of the string that each code represents. This information is tracked in each compression engine because it needs to prevent the string represented by the code from exceeding the maximum string length. This information will require "i" bits, where:

i=log$_2$(max_string_length+1), rounded up to the nearest integer.

A typical value for max_string_length is 127, which makes i=7.

Each compression engine $105_{CMY}$ must output x+i bits per code into a FIFO that is max_string_length entries long. The packer will take the data from the multiple FIFO's and combine them in such a way that they can be unpacked on the ordering of the codes.

Figure 2:
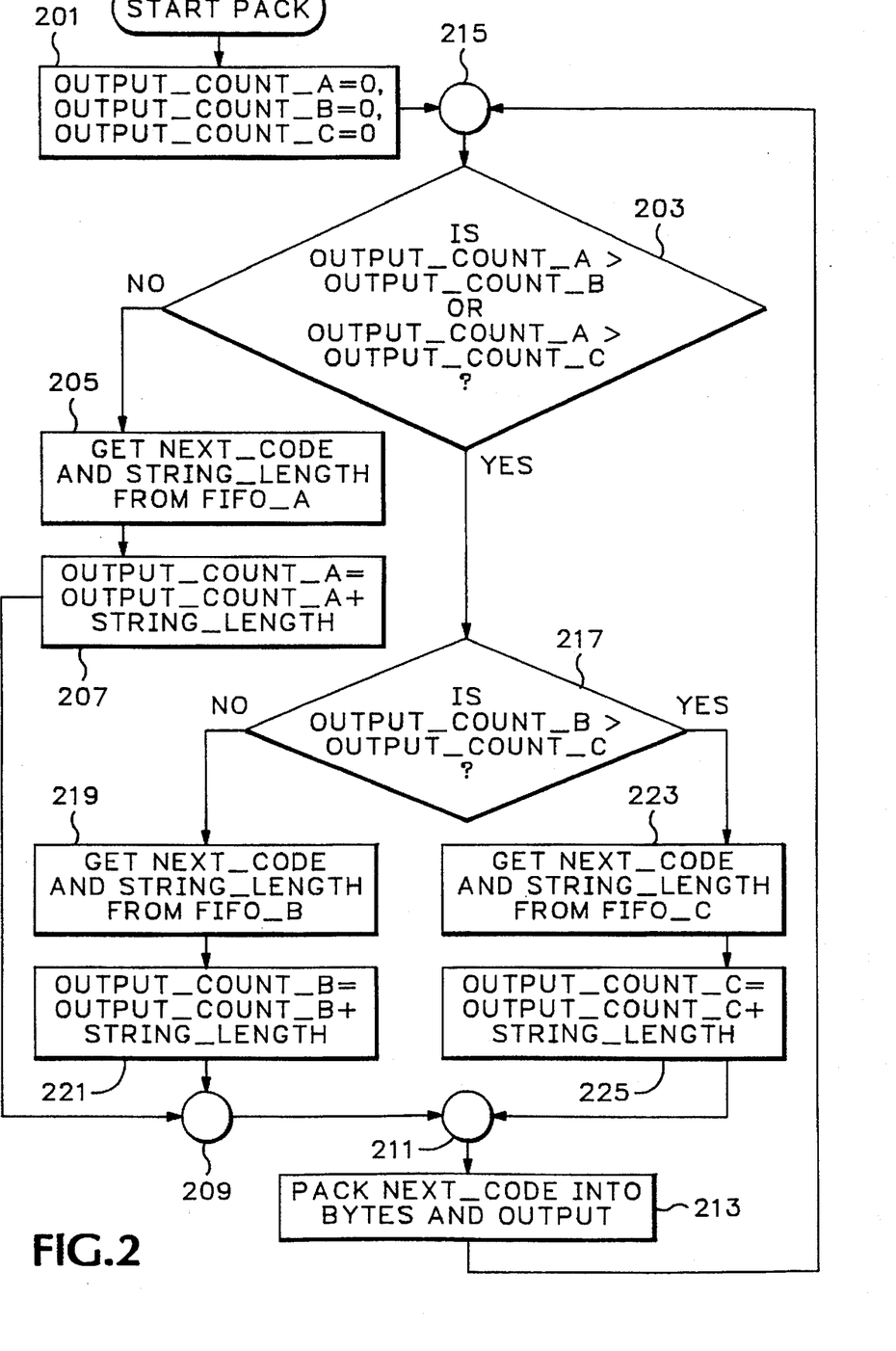
FIG. 2 is flow chart of a data PACK routine steps in accordance with the present invention.

Turning now to FIG. 2, the operation of the packer 109 used with the compression engines $103_{CMY}$ is shown for a three compression engine parallel system as shown in FIG. 1. The codes are ordered in the order that the decompressors $123_{CMY}$ are going to want them. (As the algorithm will work for any number of parallel compression engines, for the purpose of this FIGURE let A=first engine, B=second engine, C=third engine, etc., through N=last engine (not shown)).

In order to keep track of the bytes as they are sent downstream to the printer input storage buffer, memory, 113, the sum of the inputs count that have actually been sent to the output is kept. Initially, that is, before any data is transmitted, the count is set to zero, no__CODE has yet been received, therefore in the comparison, step 203, the condition is false, "N." Hence, in the next operation, step 205, the NEXT_CODE (in this instance the FIRST_CODE) is obtained from FIFO_A. The Output_count_A will thus reset to Output_count_A+STRING_LENGTH, step 207. Since this is the initial data string, Output_count_A= STRING_LENGTH. At each subsequent junction with the like information for COMPRESSION_ENGINE_B, step 209, and for COMPRESSION_ENGINE_C, step 211, which in this first pass have not been polled, there is no _B or _C code and no contention. The packer 109 the FIRST_ CODE into system length bytes and outputs, step 213, onto bus 111 (FIG. 1).

For example, if the output codes were:

```
code 1 = 0101010101
code 2 = 1111111111
code 3 = 0000000000
code 4 = 0011001100
``` then packing would appear as:

```
01010101
01111111
11110000
00000000
11001100;
``` where after code 1 is received and 01010101 is output, the remaining 01 is held until the next code.

Returning to junction point 215, and thus step 203, Output_count_A is now greater than both Output_ count_B and Output_count_C; therefore, the decision step is true, "Y." In the next step 217, since this is the second pass, the decision is false, "N," because both Output_ count_B and Output_count_C are still reset to zero from step 201. The NEXT_CODE, in this second pass that which is obtained from FIFO_B, step 219. Now, step 221, Output_count_B is reset to Output_count_B+STRING_ LENGTH; since in this second pass Output_count_B=0, Output_count_B is reset to STRING_LENGTH as was Output_count_A in the first pass. Continuing through junctions 209 and 211 again, the code from FIFO_109$_B$ is therefore packed into bytes and output on bus 111.

It will now be intuitively obvious that in the third pass, at step 217, Output_count_B must be greater than Output_ count_C and that the third NEXT_CODE is from COMPRESSION_ENGINE_C via the packer input FIFO 109$_c$, steps 223 and 225. Therefore, the code from FIFO_ 109$_c$ is packed into bytes and output on bus 111.

After this the algorithm runs based upon each respective decision step 203,217 outcome, which is data dependent.

Note that while there is a potential for ties, that is for example, Output_count A=Output count_C after the first three runs through the process, since the test is always for a "greater than" situation, step 203, the senior compressor takes control, in this example, COMPRESSION_ ENGINE_A (FIG. 1, element 105C). Note that no additional hardware is required to handle such tie break requirement events.

The process will thus continue until the last code is sent; in this exemplary embodiment, the entire image or page of data has been put into the laser printer input storage buffer 113.

Figure 3A:
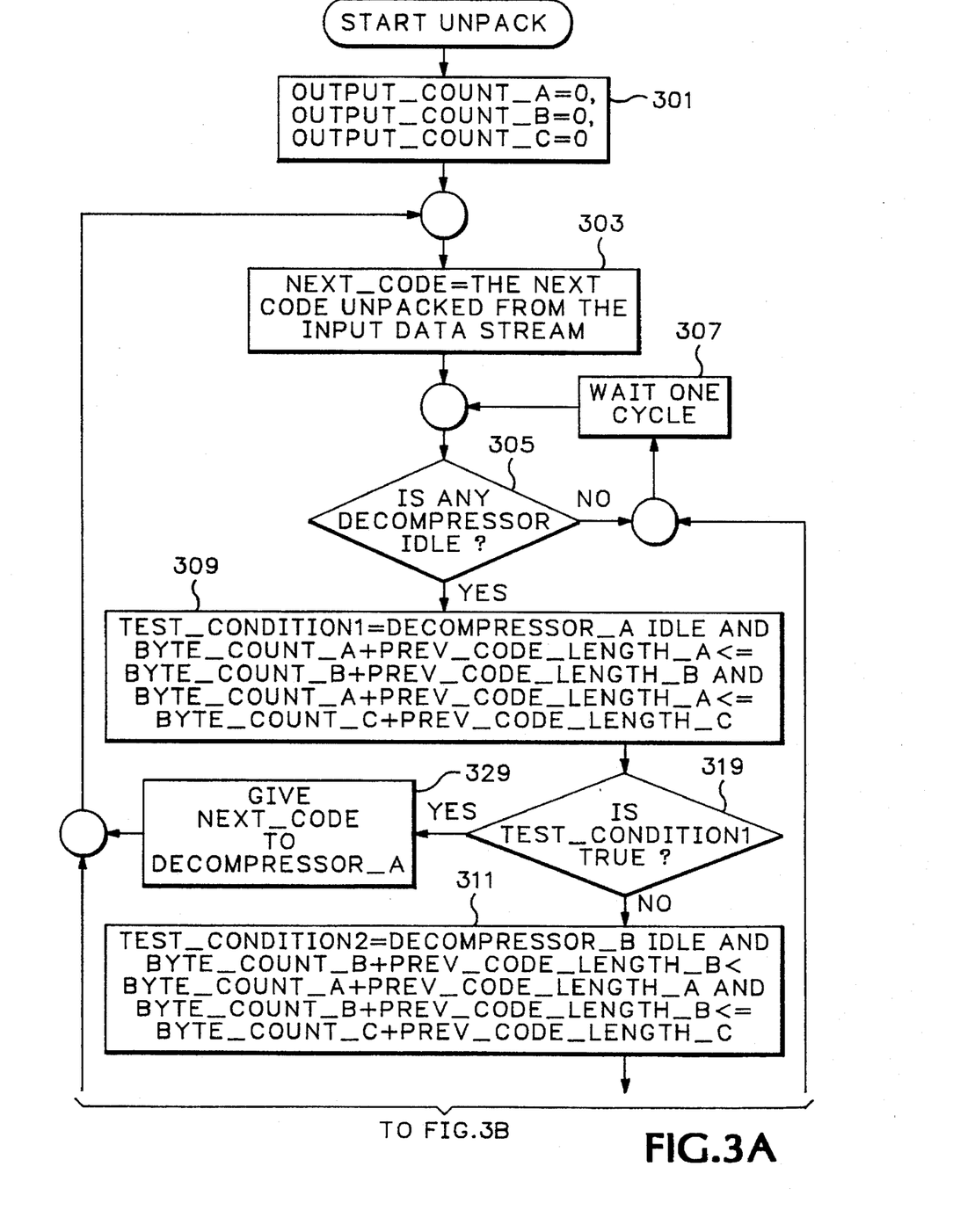
FIG. 3A and 3B are a flow chart of a data UNPACK routine steps in accordance with the present invention.
Figure 3B:
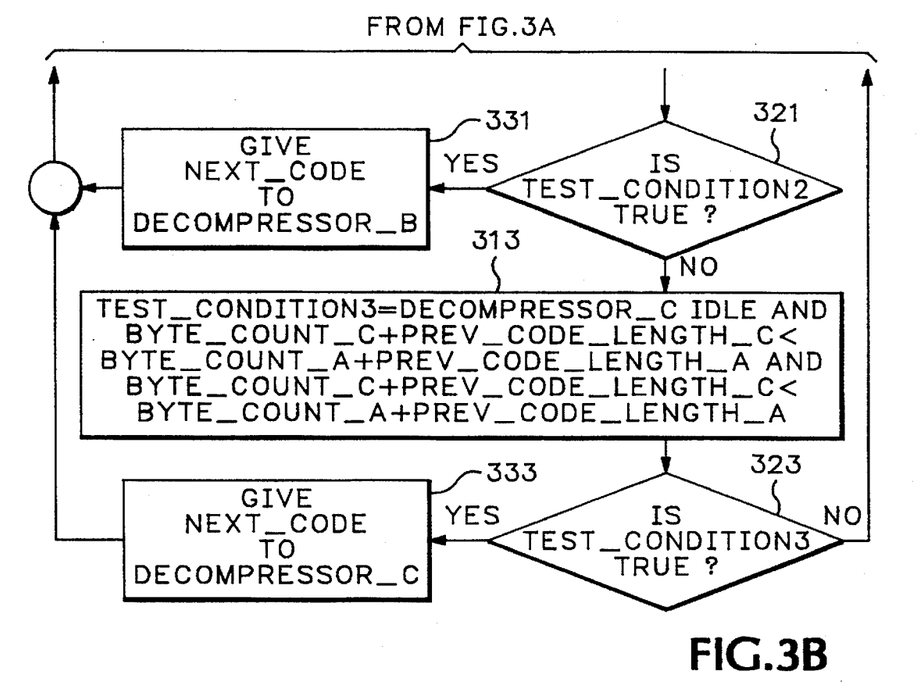

Turning now to FIGS. 3A, 3B, the unpacker 119 has the task of taking the combined, that is, "packed," compression data and distributing the codes to the individual decompression engines 123$_{CMY}$ appropriately, that is, in the correct order.

In the "unpack" process, the order of the codes received and feedback is used to determine which decompression engine 123$_{CMY}$ is to receive the current code. The feedback information is the length of the string represented by the code last decoded by either the decompression engine if the decompression engine is idle, or the length of the string that has been decoded so far if the decompression engine is currently working on a code. This information is referred to hereinafter and in FIGS. 3A, 3B as "PREV_CODE_ LENGTH." It should also be noted that the unpacker 119 does not require FIFO buffers.

As with the packing process, initially (that is, before any data is received) the count for each decompression engine is set to zero, step 301. Referring also to FIG. 1, based upon the foregoing explanation of packing in accordance with FIG. 2, after any header/control marker, the first "NEXT_CODE" on the DRAM 113 output bus/packer 119 input bus 117 must be from COMPRESSION_ENGINE_A 105C, step 303.

A series of TEST_CONDITIONs is then checked, steps 309, 311, 313, one for each DECOMPRESSION_ ENGINE_N 123$_{CMY}$.

Generalized the test is:

```
TEST_CONDITION_X=
DECOMRESSION_ENGINE_X idle AND
    BYTE_COUNT_X+PREV_CODE_LENGTH_X≤BYTE_COUNT_X+1+
        PREV_CODE_LENGTH_X+1 AND
    BYTE_COUNT_X+PREV_CODE_LENGTH_X≤BYTE_COUNT_X+2+
        PREV_CODE_LENGTH_X+2, AND
et seq. through X+last_engine_count,
    where X=A, X+1=B, X+2=C ... X+last_engine_count=N.
```

In the specific exemplary embodiment as shown in FIGS. 3A, 3B, the first time through TEST_CONDITION_1, step 309, being the test condition for DECOMPRESSION_ ENGINE_A is true, "Y," step 319, since BYTE_ COUNT_B and BYTE_COUNT_C, step 301, are both still equal to zero since the first code must be from COMPRESSION_ENGINE_A 105$_C$ as explained with respect to FIG. 2. Thus, the first NEXT_CODE, step 303, is transmitted to DECOMPRESSION_ENGINE_A 123$_C$. The process loops back to step 303.

Since the NEXT_CODE, step 303, in this second cycle of the process must be from COMPRESSION_ENGINE_B 105$_M$ and DECOMPRESSION_ENGINE_A 123$_C$ is now busy while DECOMPRESSION_ENGINE_B 123$_M$ is idle, step 305, TEST_CONDITION_2, steps 311,321 are true, "Y," and the code is sent to DECOMPRESSION_ENGINE_B 123$_M$, step 331. The process loops back to step 303.

Likewise, the NEXT_CODE, step 303, in this third cycle of the process must be from COMPRESSION_ENGINE_C 105$_C$ and DECOMPRESSION_ENGINE_C 123$_M$ idle, step 305, TEST_CONDITION_3, steps 313, 323 are true, "Y," and the code is sent to DECOMPRESSION_ENGINE_C 123$_Y$. The process loops back to step 303.

Now the unpacker 119 process has become data dependent, just as did the packer 109 process, FIG. 2. Whenever a TEST_CONDITION is false, "N," the next test is performed.

Note that after the unpacker 119 is into full cycle analysis, a test is made as to whether an appropriate DECOMPRESSION_ENGINE_N 123$_{CMY}$ is idle, step 305. Note that as long as the process is running, if the condition is false, "N," there is a one clock cycle wait loop provided, step 307.

Note also that there is a potential for a compressor to be idle and the NEXT_CODE will not be sent. For example, DECOMPRESSION_ENGINE_A 123$_C$ may be idle, but the NEXT_CODE may be from COMPRESSION_ENGINE_C 105$_Y$ and DECOMPRESSION_ENGINE_C 105$_Y$ may still be busy. Thus, all tests will fail until the next clock cycle that COMPRESSION_ENGINE_C 105$_Y$ is idle. In this manner, the process is self-correcting.

The present invention thus provides parallel processing of encoded data which will run at substantially "N" times the speed over a pipelined single compression/decompression engine system, where "N" is the number for parallel compression-decompression sets employed. While generally applicable, the present invention finds usefulness particularly for data which has multi-variable components, such as relational multi-variable content data like tristimulus color space data used in color hard copy applications.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. Similarly, any process steps described might be interchangeable with other steps in order to achieve the same result. The embodiment was chosen and described in order to best explain the principles of the invention and its best mode practical application to thereby enable others skilled in the art to understand the invention for various embodiments and with various modifications as are suited to the particular use contemplated. It is intended that the scope of the invention be defined by the claims appended hereto and their equivalents.

What is claimed is:

1. Apparatus for parallel data compression and decompression, comprising:

N data compression engines, where "N"=number of data words to be compressed in parallel;

packing means for receiving from the N data compression engines N data word codes in parallel, for serially packing received N data word codes in an order determined by order of compression and byte count for each of the N data word codes, and for transmitting N packed data word codes as a single code word data string;

N data decompression engines; and unpacking means for receiving from the packing means the single code word data string, unpacking the single code word data siring, and sending N unpacked data word codes on N parallel outputs to the N data decompression engines in a order based on length of a single code word data string represented by an unpacked data word code last decoded by either the decompression engine for that unpacked data word code if the decompression engine is idle, or the length of the single code word data string that has been decoded so far if the decompression engine is currently working on an unpacked data word code.

2. The apparatus as set forth in claim 1, further comprising:

the packing means having N, first in, first out input buffers for receiving the N data word codes in parallel and a code word data string output means for transmitting N packed data word codes as a single code word data string.

3. A method for parallel encoding of a data set wherein the data set of relational multi-variable content data set forth in data words, one for each variable of the data, the method comprising the steps of:

encoding data words in parallel into coded data words, one for each variable of the data;

transmitting the coded data words in parallel;

receiving the coded data words in a means for packing the coded data words into a single word bit string;

packing the coded data words into a single word bit string in an order based upon order of compression and byte count for each of the coded data words, respectively; and transmitting the single word bit string from the means for packing.

4. The method as set forth in claim 3, further comprising the step of:

repeating the steps for each data word of the data set.

5. The method as set forth in claim 3, the step of packing further comprising:

setting a byte output count for each of "N" input coded data words to zero, where "N"=the number of data words to be encoded in parallel, one for each variable of the data;

receiving N coded data words in a first in, first out order;

resetting the byte output count to a first byte count comprising consecutive coded data word byte counts and bit string lengths for a current coded data word;

comparing each consecutive byte output count to a next previous consecutive byte output count for a next coded data word; and ordering the coded data words in an order based upon the step of comparing in an order of compression and byte count for each coded data word.

6. A method for parallel decoding of data wherein the data comprises a series of single word bit strings containing a code for multiple coded data code words comprising data of relational multi-variable content, one data word for each of the variables, the method comprising the steps of:

receiving each of the single word bit strings in a means for unpacking the multiple coded data words;

providing a plurality of decompression engines, one for each of the variables of the data;

unpacking each of the single word bit strings in an order based upon length of a data string represented by a coded data word last decoded by either the decompres-
sion engine for that coded data word if the decompression engine is idle, or the length of the single word bit string that has been decoded so far if the decompression engine is currently working on a coded data word;

sending each unpacked coded data word to a respective decompression engine for the respective variable of the data.

7. The method as set forth in claim 6, the step of unpacking further comprising:

setting a byte output count for each plurality of "N" decompression engines to zero, where "N"=the number of coded data words to be decoded in parallel;

receiving each of the single word bit strings consecutively;

testing each byte count of a next coded data word for each of the plurality of "N" decompression engines against each other of the plurality of "N" decompression engines for the shortest byte output count; and sending the next coded data word to a decompression engine in an order based upon order of compression and byte count for each coded data word, respectively.

8. The method as set forth in claim 7, further comprising the steps of:

prior to the step of testing, determining if a decompression engine is idle; and if a decompression engine is idle, proceeding with the step of testing, or if no decompression engine is idle, waiting one clock cycle and repeating the step of determining.

9. A parallel data compression and decompression method for the transmission of tristimulus color space data for a color image comprising a plurality of pixels, the method comprising the steps of:

providing at least three parallel data compression engines and at least three parallel data decompression engines;

compression encoding in parallel at least three primary color space data words representative of a pixel into at least three data codes, one for each primary color variable of the data, in one each of the at least three parallel data compression engines, respectively;

transmitting the at least three data codes in parallel from the at least three parallel data compression engines;

receiving the at least three data codes in a means for packing the data codes into a single code bit string;

packing the at least three data codes in an order based upon order of compression and byte count for each data code, respectively;

transmitting the single code bit string;

receiving the single code bit string in a means for unpacking the data codes from the single code bit string;

sending each unpacked data code to a respective decompression engine for the respective variable of the color space data.

10. The method as set forth in claim 9, further comprising the steps of:

prior to the step of unpacking, repeating the previous steps of the method for each pixel of the image, whereby a set of single code bit strings is generated;

storing the set of single code bit strings for the entire color image; and retrieving each stored single code bit string serially in the means for unpacking the at least three data codes.

11. The method as set forth in claim 9, further comprising:

providing a fourth data compression engine and a fourth data decompression engine for compression encoding of pixels comprising the color black; and running the steps of the method in parallel for the fourth data compression engine.

12. The method as set forth in claim 9, the step of packing further comprising:

setting a byte output count for each input data code to zero;

receiving each of the data codes in a first in, first out order;

resetting the byte output count to a first byte count comprising consecutive data code bit counts and single code bit string lengths for a current data code;

comparing each consecutive byte output count to a next previous consecutive byte output count for a next data code; and ordering the data codes in an order based upon order of compression and byte count for each data code.

13. The method as set forth in claim 9, the step of unpacking further comprising:

setting a byte output count for each of the decompression engines to zero;

receiving each of the single code bit strings consecutively;

testing each byte count of a next code for each of the decompression engines against each other of the decompression engines for the shortest byte output count; and sending the next code to a decompression engine in an order based upon order of compression and byte count for each data code.

14. The method as set forth in claim 13, the step of testing comprises:

testing in accordance with the formula:

```
TEST_CONDITION_X=
DECOMRESSION_ENGINE_X idle AND
BYTE_COUNT_X+PREV_CODE_LENGTH_X≦BYTE_COUNT_X+1+
    PREV_CODE_LENGTH_X+1 AND
BYTE_COUNT_X+PREV_CODE_LENGTH_X≦BYTE_COUNT_X+2+
    PREV_CODE_LENGTH_X+2, AND
``` unpacking the single code bit string in an order based upon length of a single code bit string represented by a data code last decoded by either the decompression engine for that code word if the decompression engine is idle, or the length of the single code bit string that has been decoded so far if the decompression engine is currently working on a data code; and et seq. through X+last engine count, where X=first decompression engine, X+1=second decompression engine, X+2= third decompression engine, et seq.

15. A color hard copy data compression and decompression system comprising:

data compression means having at least three data compression engines, each having an input for receiving a color data word representative of a primary color variable for a pixel to be produced in hard copy and an output for providing at least three codes in parallel, one each representative of each respective color data word, packing means for packing at least three respective codes received from the at least three data compression engines into a single pixel code, the packing means having at least three first in, first out buffers for receiving the at least three respective codes, and means for ordering the at least three respective codes determined by order of compression and byte count for each code, a packing means output for transmitting all bits of the single pixel code; and data decompression means having at least three decompression engines;

16. The system as set forth in claim 15, further comprising:

a fourth compression engine operating in parallel with the at least three compression engines, and a fourth decompression engine operating in parallel with the at least three decompression engines, wherein the fourth compression engine and the fourth decompression engine encode a color data word representative of the color of a pixel comprising the color black.

17. The system as set forth in claim 15, said unpacking means further comprising:

means for applying a test condition for sending a next code to a decompression engine where:

---

TEST_CONDITION_X=
DECOMRESSION_ENGINE_X idle AND
BYTE_COUNT_X+PREV_CODE_LENGTH_X≦BYTE_COUNT_X+1+
PREV_CODE_LENGTH_X+1 AND
BYTE_COUNT_X+PREV_CODE_LENGTH_X≦BYTE_COUNT_X+2+
PREV_CODE_LENGTH_X+2,

--- unpacking means for receiving the single pixel code from the packing means output and for unpacking the single pixel code into the at least three respective codes and for transmitting the at least three respective codes to respective decompression engines based upon length of a data string represented by a code last decoded by either the decompression engine for that code if the decompression engine is idle, or the length of the string that has been decoded so far if the decompression engine is currently working on a code.

et seq. through X+N, where X=consecutive parallel decompression engine designations and N=total number of parallel decompression engine, for repeating the step of applying a test condition for each consecutive parallel decompression engine versus each other consecutive parallel decompression engine until a test condition occurs as true test condition, and for sending the next code to the decompression engine for which the true condition occurs.

* * * * *

UNITED STATES PATENT AND TRADEMARK OFFICE
CERTIFICATE OF CORRECTION

PATENT NO. : 5,654,703  
DATED : August 5, 1997  
INVENTOR(S) : Airell R. Clark II It is certified that error appears in the above-identified patent and that said Letters Patent is hereby corrected as shown below:

Column 3,  
Line 27, delete "the, resent" and insert therefor -- the present --  
Line 59, delete "assume" and insert therefor -- assumed --

Column 5,  
Lines 19-20, delete "the FIRST_CODE" and insert therefor -- then packs this FIRST_CODE --

Column 8,  
Line 1, delete "siring" and insert therefor -- string --

Signed and Sealed this

Thirty-first Day of December, 2002

JAMES E. ROGAN  
*Director of the United States Patent and Trademark Office*